US012578651B2

(12) United States Patent
Kato et al.

(10) Patent No.: US 12,578,651 B2
(45) Date of Patent: Mar. 17, 2026

(54) EXPOSURE APPARATUS, EXPOSURE METHOD, AND FLAT PANEL DISPLAY MANUFACTURING METHOD

(71) Applicant: NIKON CORPORATION, Tokyo (JP)

(72) Inventors: Masaki Kato, Yokohama (JP); Hitoshi Mizuno, Yokohama (JP); Yasushi Mizuno, Saitama (JP)

(73) Assignee: NIKON CORPORATION, Tokyo (JP)

( * ) Notice: Subject to any disclaimer, the term of this patent is extended or adjusted under 35 U.S.C. 154(b) by 84 days.

(21) Appl. No.: 18/535,470

(22) Filed: Dec. 11, 2023

(65) Prior Publication Data

US 2024/0103379 A1     Mar. 28, 2024

Related U.S. Application Data

(63) Continuation of application No. PCT/JP2022/026488, filed on Jul. 1, 2022.

(30) Foreign Application Priority Data

Jul. 5, 2021     (JP) ................................. 2021-111806

(51) Int. Cl.
*G03F 7/00*          (2006.01)
*G02B 26/08*          (2006.01)
(52) U.S. Cl.
CPC ..... *G03F 7/70191* (2013.01); *G02B 26/0833* (2013.01)
(58) Field of Classification Search
CPC .... G03F 7/70191; G03F 7/70291; G03F 7/20; G03F 7/70516; G03F 7/70116; G03F 7/70358; G03F 7/7085; G02B 26/0833
See application file for complete search history.

(56) References Cited

U.S. PATENT DOCUMENTS 7,719,658 B2 *   5/2010   Dorsel ................ G03F 7/70225
                                              355/53
9,581,811 B2 *   2/2017   Kita .................... G03F 7/70133
(Continued)

FOREIGN PATENT DOCUMENTS

JP        2005-266779 A        9/2005
JP        2006-350022 A        12/2006
(Continued)

OTHER PUBLICATIONS

Aug. 9, 2022 International Search Report issued in International Patent Application No. PCT/JP2022/026488.
(Continued)

*Primary Examiner* — Hung V Nguyen
(74) *Attorney, Agent, or Firm* — Oliff PLC

(57)          ABSTRACT

An exposure apparatus includes: an illumination optical system; a spatial light modulator; a projection optical system that illuminates an exposure target with light emitted from the spatial light modulator; and a stage where the exposure target is placed, wherein by the stage moving the exposure target in a predetermined scan direction, the light illuminates the exposure target by the projection optical system scans on the exposure target, the spatial light modulator includes a plurality of mirrors that rotates around a tilt axis extending in a direction orthogonal to both the scan and an optical axis directions of the projection optical system, the mirrors become an ON state by adjusting a tilt of each mirror relative to the scan direction and thereby emit light to the system, and the exposure apparatus includes an angle adjustment mechanism that adjusts a tilt angle of the spatial light modulator relative to the scan direction.

11 Claims, 13 Drawing Sheets

(56)  References Cited

U.S. PATENT DOCUMENTS

| | | | |
|---|---|---|---|
| 10,120,283 B2 * | 11/2018 | Mizuno ............... | G03F 7/70133 |
| 10,261,421 B2 * | 4/2019 | Owa ................... | G03F 7/70116 |
| 10,444,631 B2 * | 10/2019 | Deguenther ........ | G03F 7/70116 |
| 2009/0001292 A1 | 1/2009 | Okuyama | |
| 2009/0122381 A1 | 5/2009 | Owa et al. | |
| 2009/0296170 A1 | 12/2009 | Sumi | |

FOREIGN PATENT DOCUMENTS

| | | | |
|---|---|---|---|
| JP | 2009-3173 A | 1/2009 | |
| JP | 2009-008997 A | 1/2009 | |
| KR | 10-2015-0118017 A | 10/2015 | |
| WO | 2008/004664 A1 | 1/2008 | |

OTHER PUBLICATIONS

Aug. 9, 2022 Written Opinion issued in International Patent Application No. PCT/JP2022/026488.
Sep. 10, 2024 Office Action issued in Japanese Patent Application No. 2023-533105.
Apr. 18, 2025 Office Action issued in Korean Patent Application No. 10-2023-7042476.
Feb. 4, 2025 Office Action issued in Japanese Patent Application No. 2023-533105.
Jul. 29, 2025 Office Action issued in Japanese Patent Application No. 2023-533105.

* cited by examiner

FIG. 9

EXPOSURE APPARATUS, EXPOSURE METHOD, AND FLAT PANEL DISPLAY MANUFACTURING METHOD

CROSS-REFERENCE TO RELATED APPLICATION

This is a Continuation Application of International Application No. PCT/JP2022/026488, filed on Jul. 1, 2022, which claims priority on Japanese Patent Application No. 2021-111806, filed on Jul. 5, 2021. The contents of the aforementioned applications are incorporated herein by reference.

BACKGROUND

Field of the Invention

The present invention relates to an exposure apparatus, an exposure method, and a flat panel display manufacturing method.

Background

In the related art, as an exposure apparatus that illuminates a substrate with illumination light via an optical system, an exposure apparatus is known that performs an exposure by causing light which is modulated by using a spatial light modulator to pass through a projection optical system and forming an image by the light onto a resist applied to the substrate (for example, refer to Japanese Unexamined Patent Application, First Publication No. 2005-266779).

SUMMARY

According to a first aspect of the present invention, an exposure apparatus is provided which includes: an illumination optical system; a spatial light modulator that is illuminated with light from the illumination optical system; a projection optical system that illuminates an exposure target with light emitted from the spatial light modulator; and a stage on which the exposure target is placed, wherein by the stage moving the exposure target in a predetermined scan direction, the light which illuminates the exposure target by the projection optical system scans on the exposure target, the spatial light modulator includes a plurality of mirrors, each of the plurality of mirrors rotates around a tilt axis that extends in a direction orthogonal to both the scan direction and an optical axis direction of the projection optical system, the plurality of mirrors become an ON state by adjusting a tilt of each of the plurality of mirrors relative to the scan direction and thereby emit light to the projection optical system, and the exposure apparatus includes an angle adjustment mechanism that adjusts a tilt angle of the spatial light modulator relative to the scan direction.

According to a second aspect of the present invention, an exposure apparatus is provided which includes: an illumination optical system; a spatial light modulator that is illuminated with light from the illumination optical system; a projection optical system that illuminates an exposure target with light emitted from the spatial light modulator; and a stage on which the exposure target is placed, wherein by the stage moving the exposure target in a predetermined scan direction, the light which illuminates the exposure target by the projection optical system scans on the exposure target, the spatial light modulator includes a plurality of mirrors, each of the plurality of mirrors rotates around a tilt axis that extends in a direction orthogonal to both the scan direction and an optical axis direction of the projection optical system, the plurality of mirrors become an ON state by adjusting a tilt of each of the plurality of mirrors relative to the scan direction and thereby emit light to the projection optical system, and the spatial light modulator is tilted relative to the scan direction.

According to a third aspect of the present invention, an exposure method is provided which is a method of exposing the exposure target by using the exposure apparatus described above, the exposure method including: a first step in which the spatial light modulator is tilted relative to the scan direction based on a difference, when in order to cause one or more mirrors of the plurality of mirrors to be in an ON state, the one or more mirrors are rotated around the tilt axis, between a target tilt angle of the one or more mirrors and an actual tilt angle of the one or more mirrors; and a second step in which after the first step, the exposure target is exposed by using the exposure apparatus.

According to a fourth aspect of the present invention, a flat panel display manufacturing method is provided which includes: exposing the exposure target by the exposure method described above; and developing the exposed exposure target.

According to a fifth aspect of the present invention, an exposure apparatus is provided which includes: an illumination optical system; a spatial light modulator that is illuminated with light from the illumination optical system; a projection optical system that illuminates an exposure target with light emitted from the spatial light modulator; and a stage on which the exposure target is placed, wherein the illumination optical system and the spatial light modulator are arranged side by side in the scan direction.

According to a sixth aspect of the present invention, an exposure apparatus is provided which includes: a stage that moves an exposure target in a scan direction; a spatial light modulator; an illumination optical system that illuminates the spatial light modulator from the scan direction; and a projection optical system that illuminates the exposure target with light reflected by a mirror of the spatial light modulator, wherein the mirror of the spatial light modulator is tilted relative to the scan direction.

BRIEF DESCRIPTION OF THE DRAWINGS

FIG. 9 is a view showing a distribution of a light intensity when every other rows in a scan direction of the plurality of mirrors become an ON state in the spatial light modulator of the present embodiment.

DESCRIPTION OF EMBODIMENTS

Figure 1:
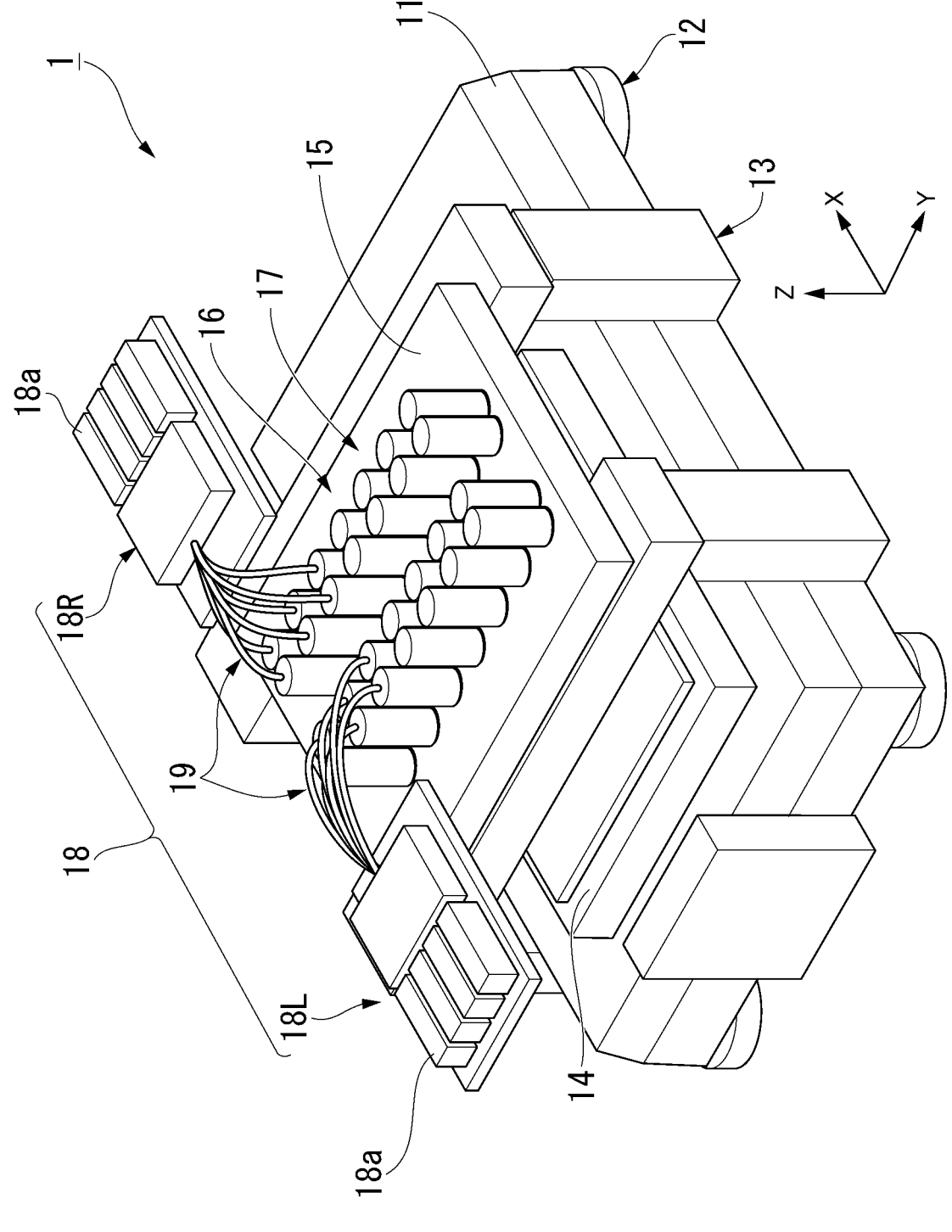
FIG. 1 is a view showing an outline of an external configuration of an exposure apparatus according to the present embodiment.

Hereinafter, embodiments of the present invention will be described with reference to the drawings. The following detailed description of the present invention is merely an example, and the present invention is not limited thereto. The same or similar reference numerals are used throughout the drawings and the following detailed description.
[Configuration of Exposure Apparatus]

FIG. 1 is a view showing an outline of an external configuration of an exposure apparatus 1 of the present embodiment. The exposure apparatus 1 is an apparatus that irradiates an exposure target object with modulation light. In a particular embodiment, the exposure apparatus 1 is a step-and-scan projection exposure apparatus which is a so-called scanner in which a rectangular (square) glass substrate used for a liquid crystal display device (flat panel display) or the like is the exposure target object. At least the length of one side or the diagonal length of the glass substrate as the exposure target object is 500 mm or more and may be a substrate for a flat panel display. The exposure target object (for example, a substrate for a flat panel display) exposed by the exposure apparatus 1 is developed and is thereby provided as a product.

An apparatus main body of the exposure apparatus 1 is constituted similarly to, for example, an apparatus main body disclosed in United States Patent Application, Publication No. 2008/0030702. The exposure apparatus 1 exposes the exposure target object with an exposure pattern determined based on an input recipe.

The exposure apparatus 1 includes a base 11, a vibration isolation table 12, a main column 13, a stage 14, an optical surface plate 15, an illumination module 16, a projection module 17 (projection optical system), a light source unit 18, an optical fiber 19, and a light modulation unit 20 (not shown in FIG. 1).

The following embodiment is described using a three-dimensional orthogonal coordinate system in which a direction parallel to an optical axis direction of the projection module 17 that irradiates the exposure target object with light modulated by the light modulation unit 20 is an Z-axis direction, and a direction of a predetermined plane orthogonal to the Z-axis is an X-axis direction and a Y-axis direction, if necessary. The X-axis direction and the Y-axis direction are directions orthogonal to (intersecting) each other.

The base 11 is a base table of the exposure apparatus 1 and is arranged on the vibration isolation table 12. The base 11 supports the stage 14 on which the exposure target object is placed such that the stage 14 is movable in the X-axis direction and the Y-axis direction.

The stage 14 supports the exposure target object, performs positioning of the exposure target object with high accuracy with respect to a plurality of partial images of a circuit pattern projected via the projection module 17 in a scanning exposure, and drives the exposure target object in six-degree-of-freedom directions (the X-axis, Y-axis, and Z-axis directions described above and Ox, Oy, and Oz directions which are rotational directions with respect to each axis). The stage 14 is moved in the X-axis direction at the time of the scanning exposure and is moved in the Y-axis direction when changing an exposure target region on the exposure target object. A plurality of exposure target regions are formed on the exposure target object. The exposure apparatus 1 can expose each of a plurality of exposure target regions on one exposure target object. The configuration of the stage 14 is not specifically limited; however, a stage device having a so-called coarse micromotion configuration that includes a gantry-type two-dimensional coarse motion stage and a micromotion stage which is minutely driven relative to the two-dimensional coarse motion stage as disclosed in United States Patent Application, Publication No. 2012/0057140 or the like can be used. In this case, the exposure target object is movable in three-degree-of-freedom directions in a horizontal plane by the coarse motion stage, and the exposure target object is minutely movable in the six-degree-of-freedom directions by the micromotion stage.

The main column 13 supports the optical surface plate 15 above (a positive direction of the Z-axis) the stage 14. The optical surface plate 15 supports the illumination module 16, the projection module 17, and the light modulation unit 20.

Figure 2:
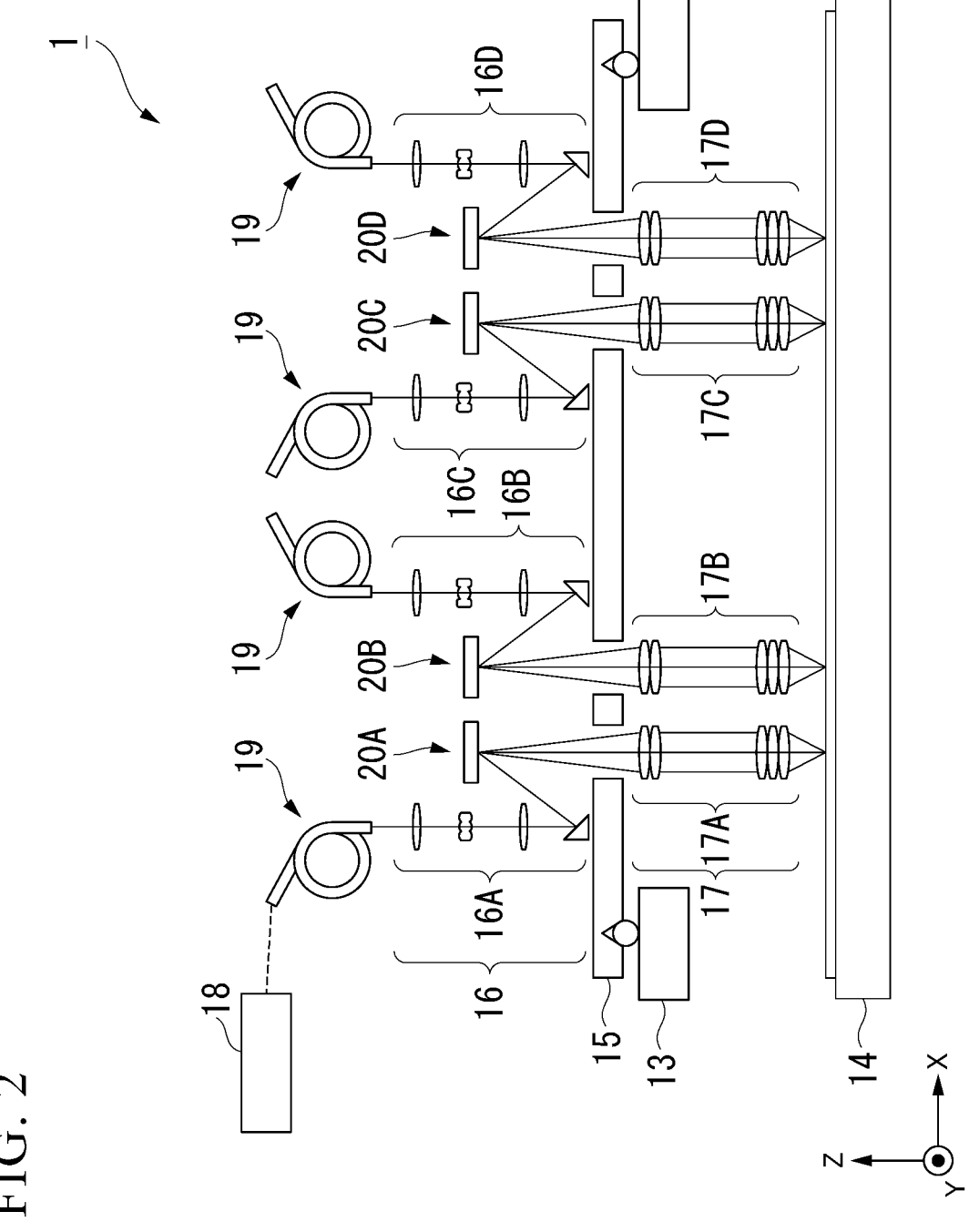
FIG. 2 is a view showing an outline of a configuration of an illumination module and a projection module of the present embodiment.

FIG. 2 is a view showing an outline of a configuration of the illumination module 16, the projection module 17, and the light modulation unit 20 of the present embodiment.

The illumination module 16 is arranged above the optical surface plate 15 and is connected to the light source unit 18 via the optical fiber 19. In an example of the present embodiment, the illumination module 16 includes a first illumination module 16A, a second illumination module 16B, a third illumination module 16C, and a fourth illumination module 16D. In the following description, when the first illumination module 16A to the fourth illumination module 16D are not distinguished, the first illumination module 16A to the fourth illumination module 16D are collectively referred to as the illumination module 16.

Each of the first illumination module 16A to the fourth illumination module 16D guides light emitted from the light source unit 18 via the fiber 19 to each of a first light modulation unit 20A, a second light modulation unit 20B, a third light modulation unit 20C, and a fourth light modulation unit 20D. The illumination module 16 illuminates the light modulation unit 20. The first illumination module 16A and the first light modulation unit 20A are arranged side by side in a scan direction. The second illumination module 16B and the second light modulation unit 20B are arranged side by side in the scan direction. The third illumination module 16C and the third light modulation unit 20C are arranged side by side in the scan direction. The fourth illumination module 16D and the fourth light modulation unit 20D are arranged side by side in the scan direction.

The light modulation unit 20 is described in detail later, but is controlled based on the circuit pattern to be transferred to the exposure target object and modulates the illumination light from the illumination module 16. The modulation light modulated by the light modulation unit 20 is guided to the projection module 17. The first light modulation unit 20A to the fourth light modulation unit 20D are arranged at different positions from one another in the XY plane. In the following description, when the first light modulation unit 20A to the fourth light modulation unit 20D are not distinguished, the first light modulation unit 20A to the fourth light modulation unit 20D are collectively referred to as the light modulation unit 20.

The projection module 17 is arranged below the optical surface plate 15 and illuminates the exposure target object placed on the stage 14 with the modulation light modulated by a spatial light modulator 201. The projection module 17 forms an image of the light modulated by the light modulation unit 20 on the exposure target object and exposes the exposure target object. In other words, the projection module 17 projects a pattern on the light modulation unit 20 onto the exposure target object. A plane including an optical axis of the illumination light that illuminates the light modulation unit 20 and an optical axis of the projection module 17 are provided in parallel with the scan direction (X-axis direction). In an example of the present embodiment, the projection module 17 includes a first projection module 17A to a fourth projection module 17D corresponding to the first illumination module 16A to the fourth illumination module 16D and the first light modulation unit 20A to the fourth light modulation unit 20D described above. In the following description, when the first projection module 17A to the fourth projection module 17D are not distinguished, the first projection module 17A to the fourth projection module 17D are collectively referred to as the projection module 17.

A unit constituted of the first illumination module 16A, the first light modulation unit 20A, and the first projection module 17A is referred to as a first exposure module. Similarly, a unit constituted of the second illumination module 16B, the second light modulation unit 20B, and the second projection module 17B is referred to as a second exposure module. Each exposure module can be provided at different positions from each other on the XY plane and expose a pattern to different positions of the exposure target object placed on the stage 14. The stage 14 relatively moves in the X-axis direction which is the scan direction relative to the exposure module and can thereby perform scanning exposure of the entire surface of the exposure target object or the entire surface in the exposure target region.

The illumination module 16 is also referred to as an illumination system. The illumination module 16 (illumination system) illuminates the spatial light modulator 201 (spatial light modulation element) described later of the light modulation unit 20.

Further, the projection module 17 is also referred to as a projection unit. The projection module 17 (projection unit) may be an equivalent magnification system that projects an image of a pattern on the light modulation unit 20 at the same magnification, or may be a magnification-increasing system or a magnification-decreasing system. Further, the projection module 17 is preferably constituted of single or two types of glass materials (particularly, quartz or fluorite).

As shown in FIG. 1, a pair (a light source unit 18R and a light source unit 18L) of light source units 18 are provided. As the light source unit 18, a light source unit in which a laser having high coherency is a light source, a light source unit using a light source such as a semiconductor-laser-type UV-LD, and a light source unit using a lens-relay-type retarder can be employed. Examples of a light source 18a included in the light source unit 18 include a lamp or a laser diode that emits light having a wavelength such as 405 nm or 365 nm.

In addition to the units described above, the exposure apparatus 1 includes a position measurement unit (not shown) constituted of an interferometer, an encoder, or the like and measures a relative position of the stage 14 relative to the optical surface plate 15.

In addition to the units described above, the exposure apparatus 1 includes an AF (Auto Focus) unit (not shown) that measures a position in the Z-axis direction of the stage 14 or the exposure target object on the stage 14. Further, the exposure apparatus 1 includes an alignment unit (not shown) that measures, when another pattern is overlapped and exposed on a pattern that has already exposed on the exposure target object, a relative position of the patterns. The AF unit and/or the alignment unit may have a configuration of a TTL (Throw the lens) that measures via the projection module 17.

Figure 3:
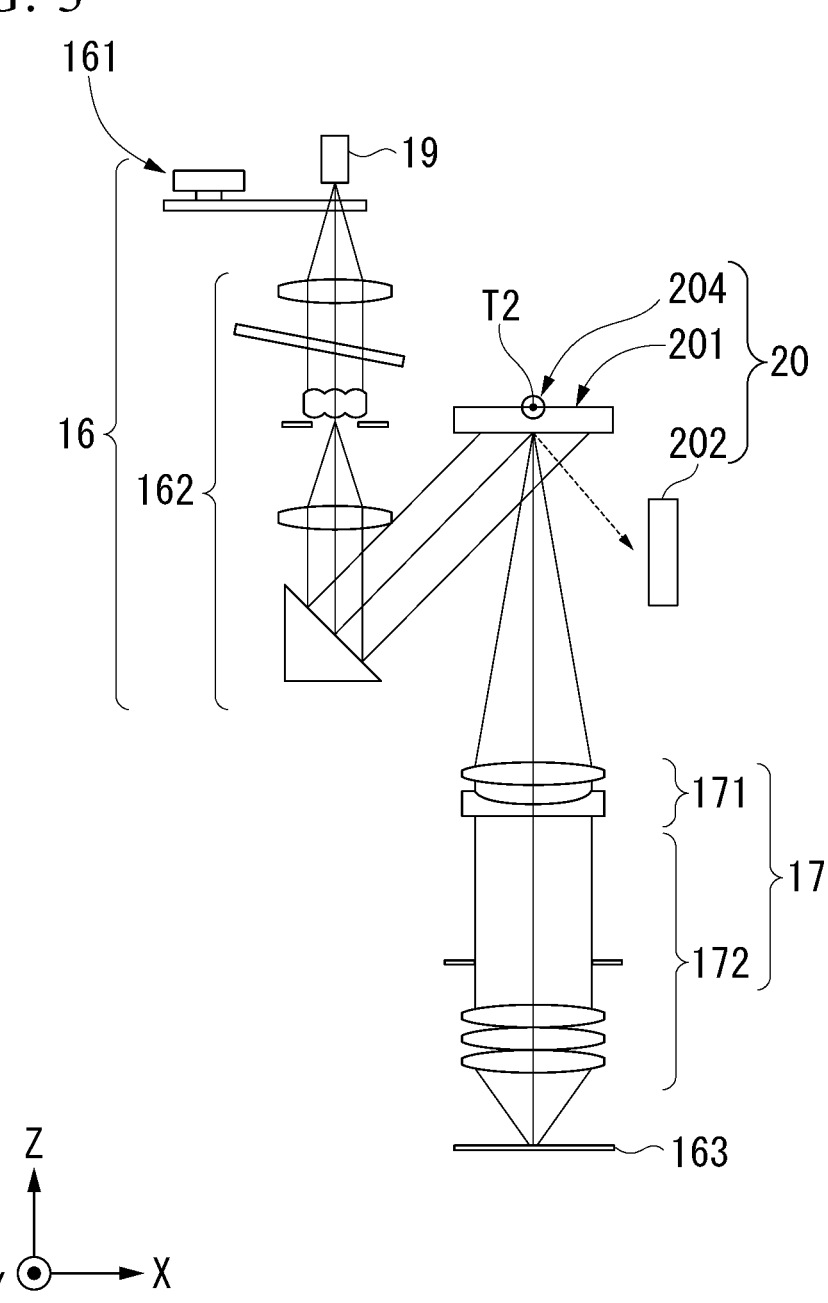
FIG. 3 is a view showing an outline of the configuration of the illumination module of the present embodiment.

FIG. 3 is a view showing an outline of a configuration of the exposure module of the present embodiment. An example of a specific configuration of the illumination module 16, the light modulation unit 20, and the projection module 17 is described with reference to the first exposure module as an example.

The illumination module 16 includes a module shutter 161 and an illumination optical system 162.

The module shutter 161 switches whether or not pulsed light supplied from the optical fiber 19 is guided to the illumination optical system 162.

The illumination optical system 162 emits the pulsed light supplied from the optical fiber 19 to the light modulation unit 20 through a collimator lens, a fly-eye lens, a condenser lens, or the like and thereby illuminates the light modulation unit 20 substantially uniformly. The fly-eye lens performs wavefront splitting of the pulsed light that enters the fly-eye lens. The condenser lens superimposes the light on which the wavefront splitting is performed on the light modulation unit. The illumination optical system 162 may include a rod integrator instead of the fly-eye lens. The illumination optical system 162 and the light modulation unit 20 are arranged side by side in the scan direction.

The light modulation unit 20 includes a mask. The mask is a spatial light modulator (SLM: spatial Light Modulator).

The light modulation unit 20 includes the spatial light modulator 201 and an off-light absorption plate 202. The spatial light modulator 201 is a digital mirror device (a digital micromirror device, a DMD). The spatial light modulator 201 can modulate the illumination light spatially and temporally.

Figure 4:
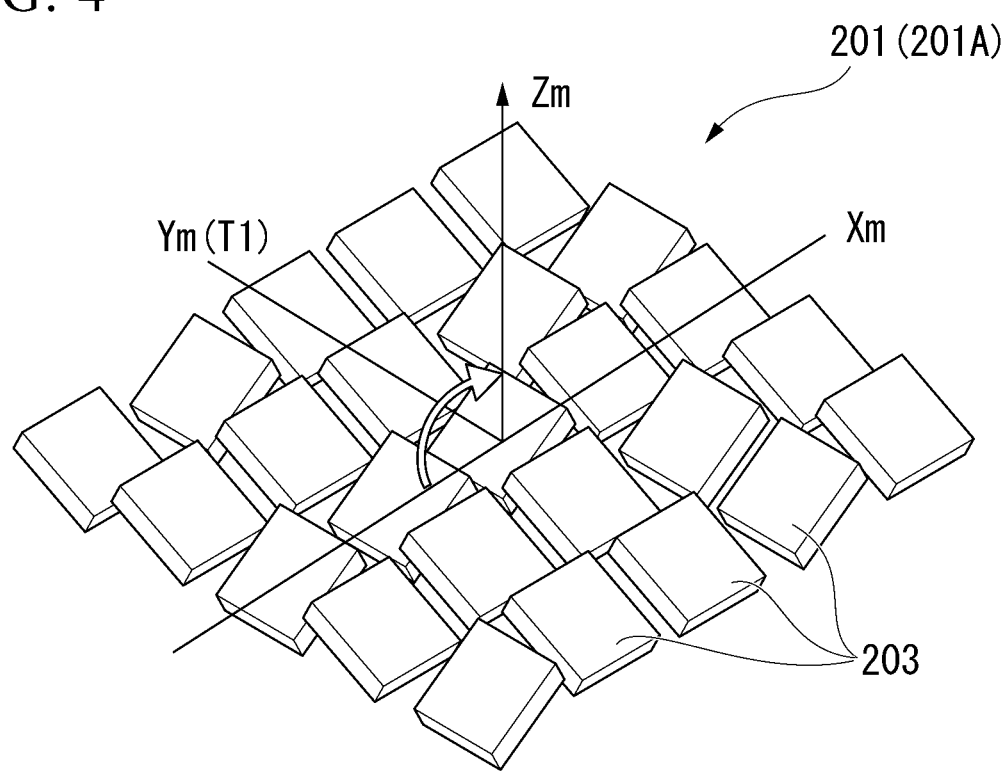
FIG. 4 is a view showing an outline of a configuration of a light modulation unit of a first example of the present embodiment.
Figure 5:
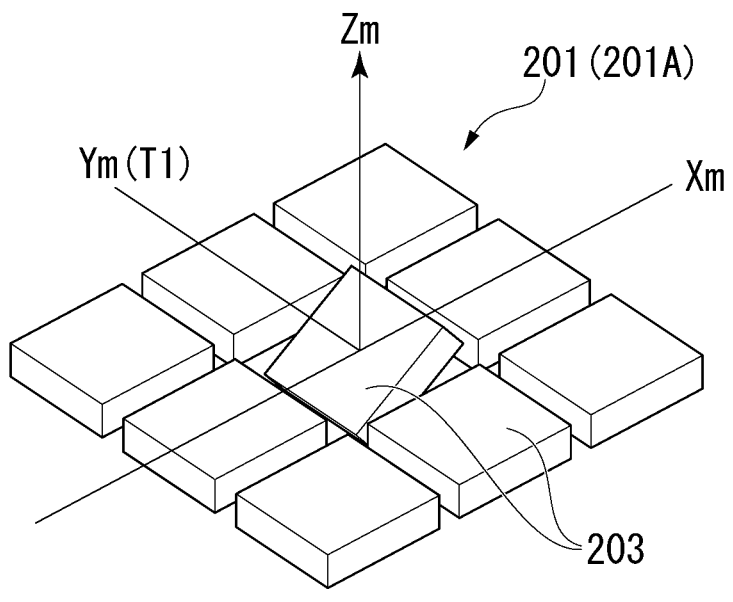
FIG. 5 is a view showing an outline of the configuration of the light modulation unit of the first example of the present embodiment and is a view showing an ON state of a mirror at the middle of the plane of paper.
Figure 6:
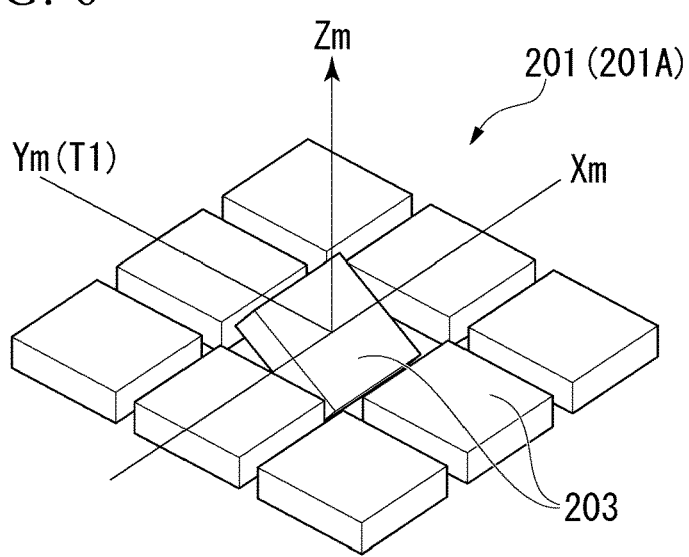
FIG. 6 is a view showing an outline of the configuration of the light modulation unit of the first example of the present embodiment and is a view showing an OFF state of the mirror at the middle of the plane of paper.

FIG. 4 is a view showing an outline of a configuration of the spatial light modulator 201 of the present embodiment. In the figure, a three-dimensional orthogonal coordinate system of an Xm axis, an Yin axis, and a Zm axis is used. The spatial light modulator 201 includes a plurality of micromirrors 203 (mirror) aligned in an XmYm plane. The micromirror 203 constitutes an element (pixel) of the spatial light modulator 201. The spatial light modulator 201 can change each tilt angle around the Xm axis and around the Ym axis. For example, the spatial light modulator 201 becomes an ON state by tilting around the Ym axis as shown in FIG. 5 and becomes an OFF state by tilting around the Xm axis as shown in FIG. 6.

The spatial light modulator 201 controls a direction in which incident light is reflected for each element by switching the tilt direction of the micromirror 203 for each micromirror 203. As an example, the digital micromirror device of the spatial light modulator 201 has a pixel count of about 4M pixels, and the micromirror 203 can be switched between an ON state and an OFF state at a period of about 10 kHz.

In the spatial light modulator 201, a plurality of elements are individually controlled at a predetermined time interval. When the spatial light modulator 201 is the DMD, the element is the micromirror 203, and the predetermined time interval is a period (for example, a period of 10 kHz) at which the micromirror 203 is switched between the ON state and the OFF state.

With reference back to FIG. 3, the off-light absorption plate 202 absorbs light (off-light) emitted (reflected) from an element in an OFF state of the spatial light modulator 201. Light emitted from an element in an ON state of the spatial light modulator 201 is guided to the projection module 17.

The projection module 17 projects light emitted from the element in the ON state of the spatial light modulator 201 onto the exposure target object. The projection module 17 includes a magnification adjustment unit 171 and a focus adjustment unit 172. Light (modulation light) modulated by the spatial light modulator 201 enters the magnification adjustment unit 171.

The magnification adjustment unit 171 drives some lenses in the optical axis direction and thereby adjusts the magnification of an image on a focal plane 163 of the modulation light emitted from the spatial light modulator 201, that is, a surface of the exposure target object.

The focus adjustment unit 172 drives the entire lens group in the optical axis direction and thereby adjusts the imaging position, that is, the focus such that the modulation light emitted from the spatial light modulator 201 forms an image on the surface of the exposure target object measured by the AF unit described above.

The projection module 17 projects only an image of the light emitted from the element in the ON state of the spatial light modulator 201 onto the surface of the exposure target object. Therefore, the projection module 17 can perform the projection exposure of an image of a pattern formed by the ON elements of the spatial light modulator 201 on the surface of the exposure target object. That is, the projection module 17 can form modulation light that is spatially modulated on the surface of the exposure target object. Further, since the spatial light modulator 201 can switch between the ON state and the OFF state of the micromirror 203 at a predetermined period (frequency) as described above, the projection module 17 can form modulation light that is temporally modulated on the surface of the exposure target object.

That is, the exposure apparatus 1 changes a state of a substantial pupil at any exposure position and performs the exposure.

[Tilt of Micromirror of Spatial Light Modulator]

Figure 7:
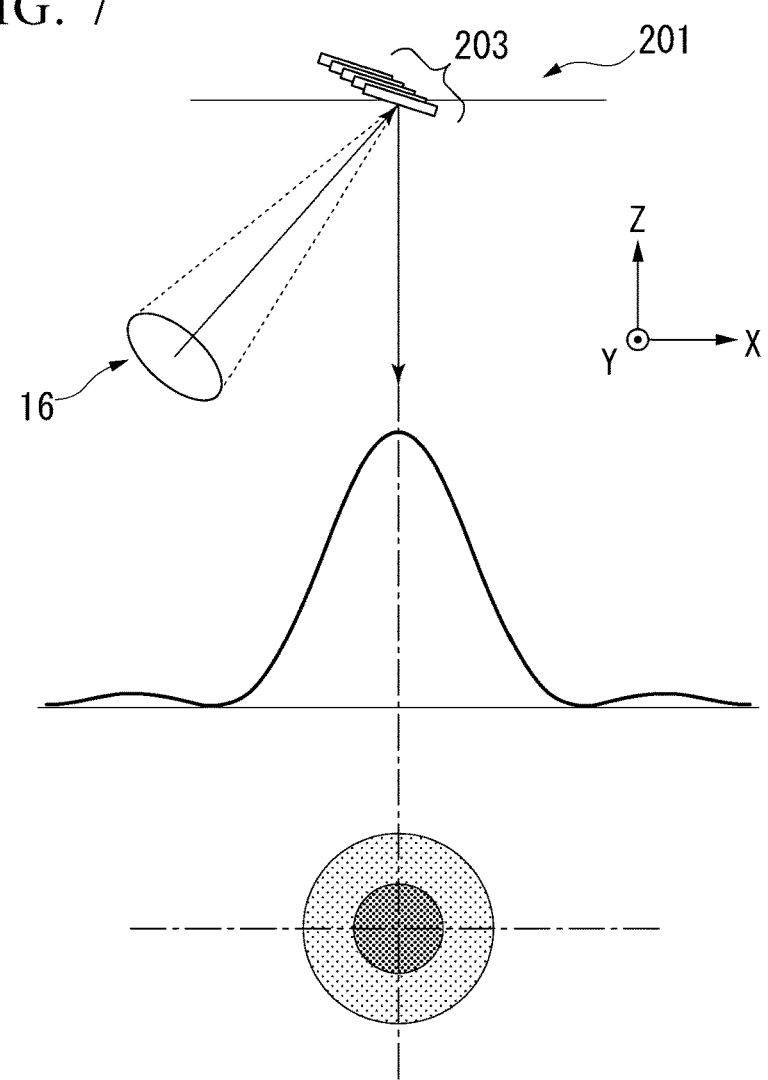
FIG. 7 is a view showing a distribution of a light intensity when one row of a plurality of mirrors becomes an ON state in a spatial light modulator of the present embodiment.
Figure 8:
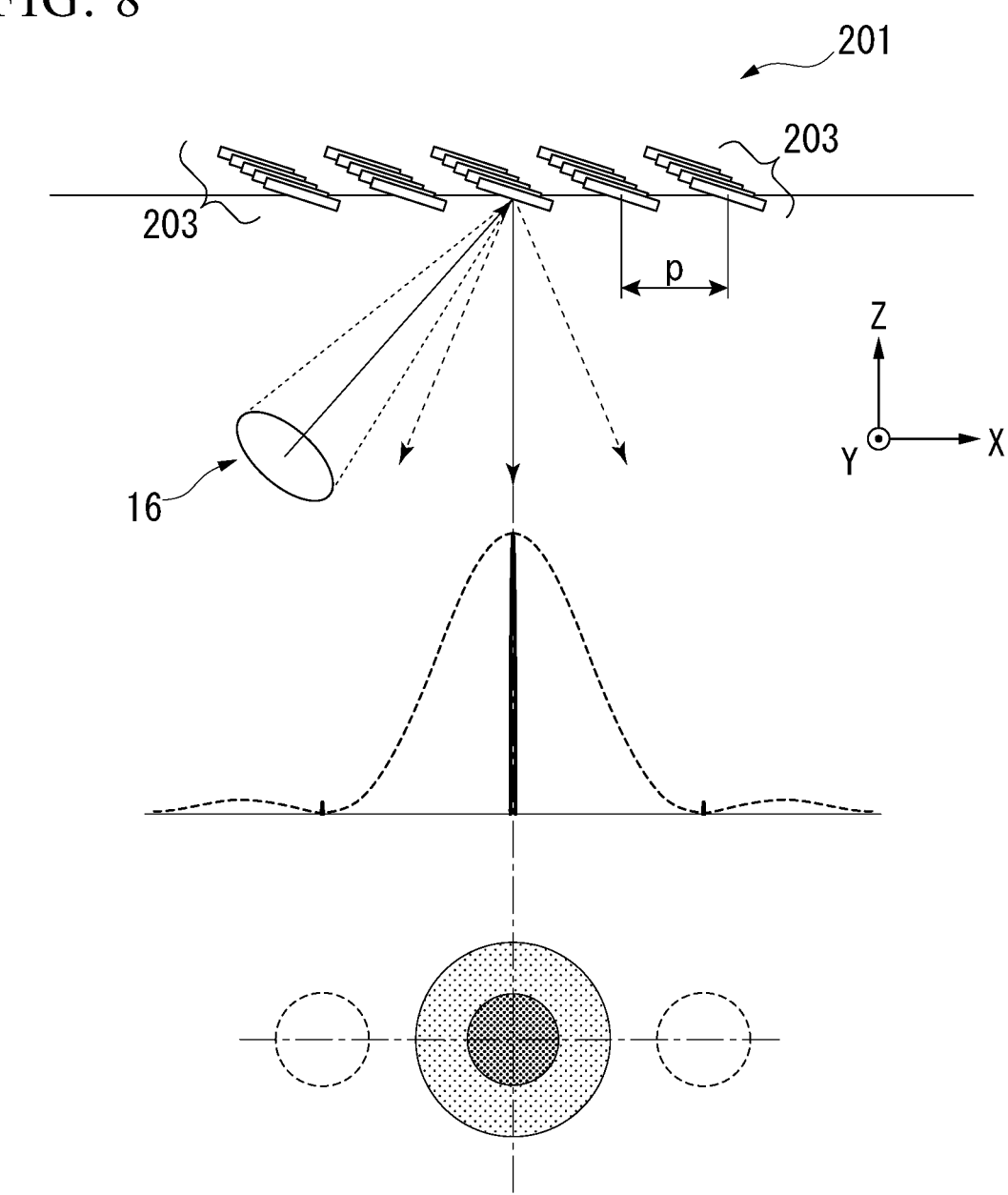
FIG. 8 is a view showing a distribution of a light intensity when all rows of the plurality of mirrors become an ON state in the spatial light modulator of the present embodiment.
Figure 9:
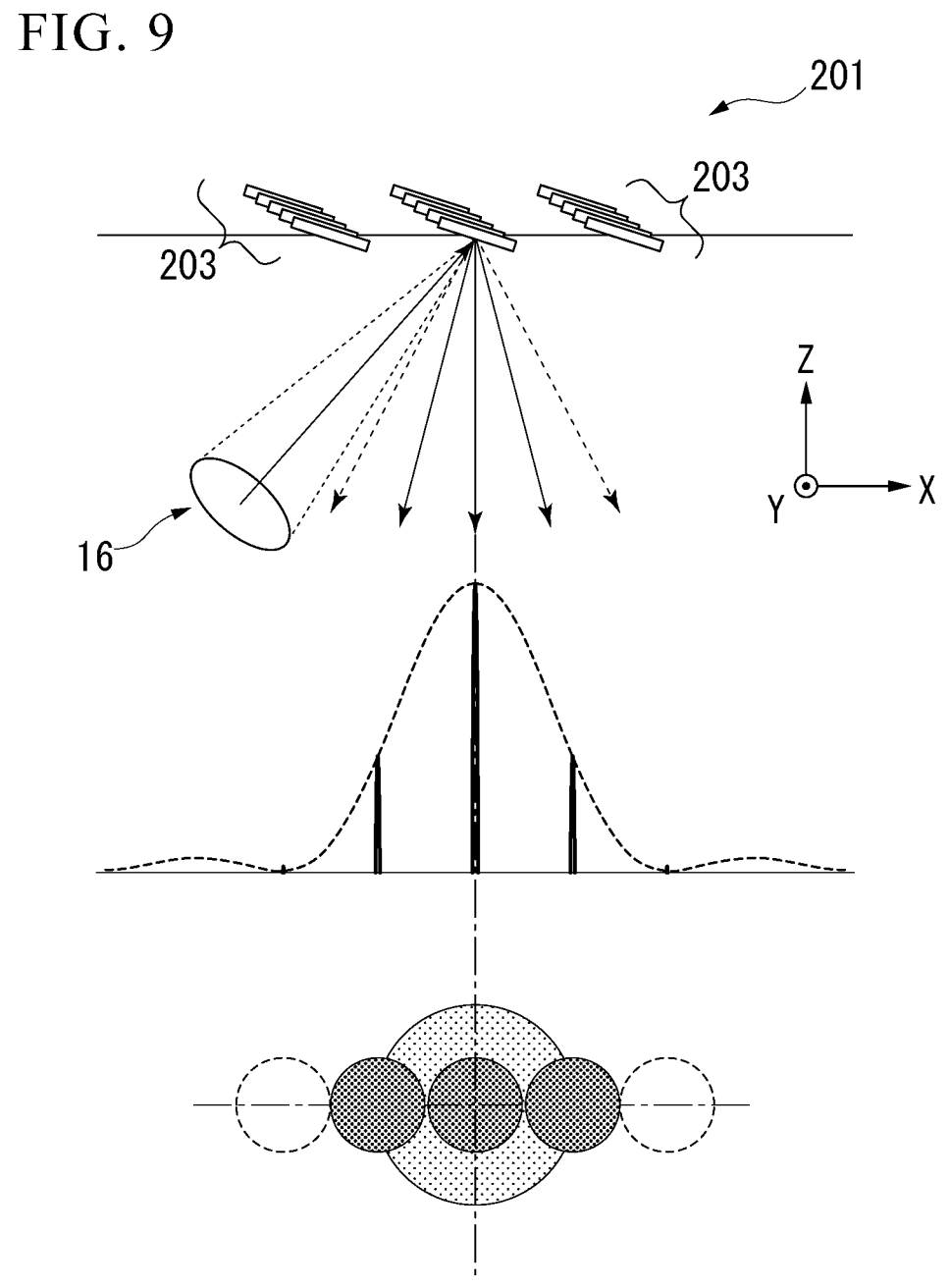

FIG. 7 to FIG. 9 are views showing a relationship between a state of the spatial light modulator 201 and a distribution of a light intensity. Each of these figures includes three parts, i.e., upper, middle, and lower parts. The upper part in each FIG. is a view showing a position of a micromirror 203 in an ON state of the spatial light modulator 201. The middle and lower parts in each figure are views showing the distribution of the light intensity in the image plane. In the upper, middle, and lower parts, the position in the right-to-left direction of the plane of paper is adjusted with reference to the optical axis of the projection module 17.

As in the present embodiment, the spatial light modulator 201 in which each micromirror 203 such as the DMD is tilted is treated as a blazed grating. As shown in the upper part of FIG. 7, when only one row of the micromirrors 203 of the DMD is turned on, the spatial light modulator 201 reflects light similarly to the case in which the whole is one mirror. In this case, the light intensity is determined by a sinc2 function as shown in the middle and lower parts of FIG. 7. In the sinc2 function, regular reflection light that is determined by a tilt angle of the micromirror 203 is located at a peak position.

On the other hand, when all the micromirrors 203 of the DMD is turned on as shown in the upper part of FIG. 8 or when every other row of the micromirrors 203 of the DMD is turned on (that is, a pattern such as the L/S (line and space)) as shown in the upper part of FIG. 9, the light intensity becomes discrete as shown in the middle and lower parts of FIG. 8 or in the middle and lower parts of FIG. 9, respectively. The light intensity of diffracted light generated at this time is locally enhanced at a position of a diffraction angle determined by a pitch p of the micromirror 203. The distribution of the discrete light intensity of the diffracted light as shown in FIG. 8 and FIG. 9 is determined based on zero-order light that is regularly reflected and the pitch p of the micromirror 203.

Here, the peak position of the sinc2 function representing the light intensity of the diffracted light depends on the tilt angle of the micromirror 203. If the tilt of the individual micromirror 203 is deviated by $\delta$ from a target angle, the reflection light is deviated by $2\delta$ from the target angle and enters the projection module 17. In this way, when the individual micromirror 203 itself of the spatial light modulator 201 has a tilt error, as a method of offsetting the error, a strategy of tilting the illumination module 16 (incident light) is conceivable. However, when the tilt error of the micromirror 203 is large, the range in which the illumination system can be adjusted is finite. Therefore, in some cases, an inconvenience may occur such as, for example, that a plurality of components of the illumination module 16 interferes with each other and cannot be aligned.

In order to resolve such an inconvenience, in the present embodiment, the micromirror 203 itself is tilted in the X-axis direction which is the scan direction, and the spatial light modulator 201 itself is also tilted in the scan direction. The measurement of the tilt error of the micromirror 203 can be performed, for example, by irradiating one mirror with light and observing the angle of the reflection light prior to the mounting in the exposure apparatus 1.

[Configuration of the Light Modulation Unit]

In order to realize the configuration according to the present embodiment as described above, in a spatial light modulator 201A of the first example shown in FIG. 4 to FIG. 6, the Xm axis becomes substantially parallel to the X axis, and the Ym axis becomes substantially parallel to the Y axis. Thereby, the micromirror 203 (the micromirror 203 tilted around the Ym axis) in the ON state is tilted relative to the X-axis direction which is the scan direction. The case where the Xm axis is substantially parallel to the X axis includes the case where the Xm axis is rotated by about ±5 degrees around the Zm axis relative to the X axis. Similarly, the case where the Ym axis is substantially parallel to the Y axis includes the case where the Ym axis is rotated by about ±5 degrees around the Zm axis relative to the Y axis. According to such an arrangement, the resolution of the spatial light modulator 201A can be increased. However, the Xm axis may be completely parallel to the X axis, and the Yin axis may be completely parallel to the Y axis.

Hereinafter, the Ym axis is also referred to as a first tilt axis T1. In the spatial light modulator 201A of the first example, each the plurality of micromirrors 203 rotates around the first tilt axis T1 (Ym axis), the plurality of micromirrors 203 adjust the tilts of the plurality of micromirrors 203 relative to the scan direction and become the ON state, and thereby, light is emitted to the projection module 17.

In the spatial light modulator 201A of the first example, the plurality of micromirror 203 are linearly aligned in the scan direction, and the plurality of micromirrors 203 are also aligned in the first tilt axis T1 direction.

Figure 10:
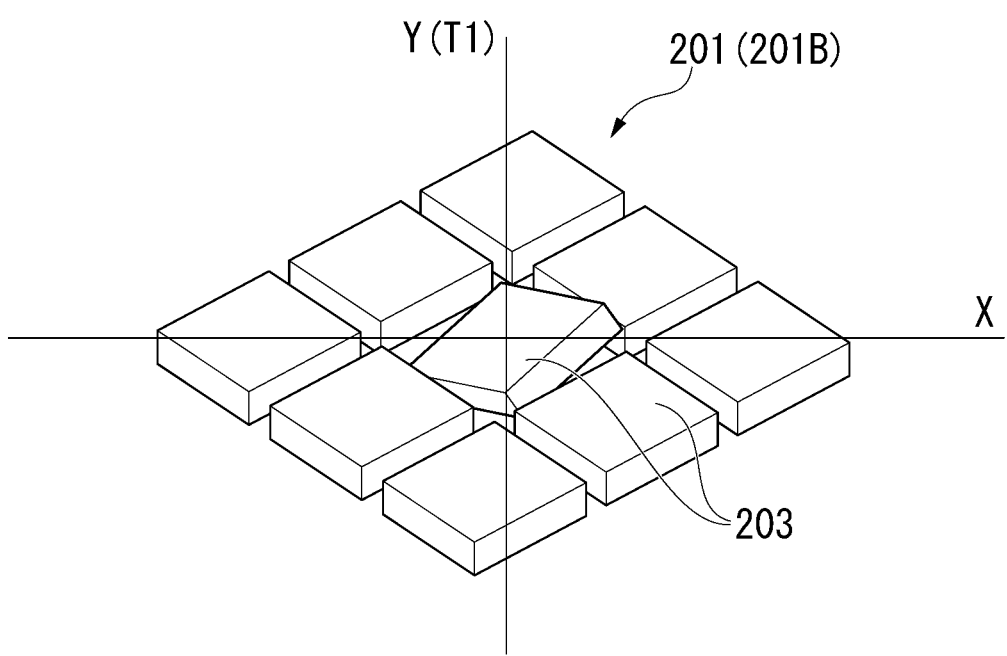
FIG. 10 is a view showing an outline of a configuration of a light modulation unit of a second example of the present embodiment and is a view showing an ON state of a mirror at the middle of the plane of paper.
Figure 11:
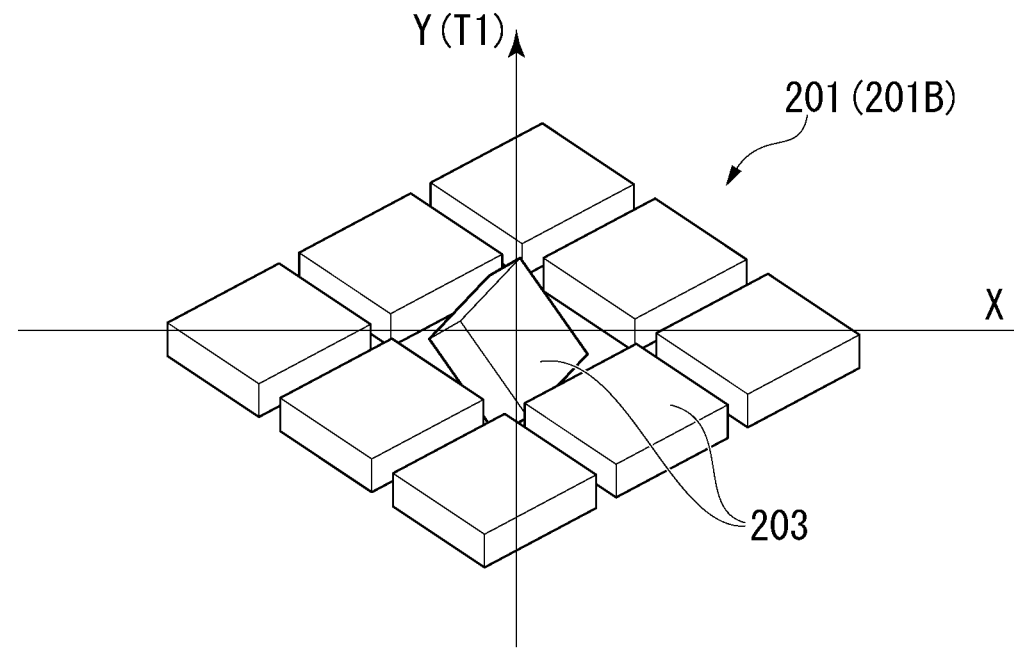
FIG. 11 is a view showing an outline of the configuration of the light modulation unit of the second example of the present embodiment and is a view showing an OFF state of the mirror at the middle of the plane of paper.
Figure 12:
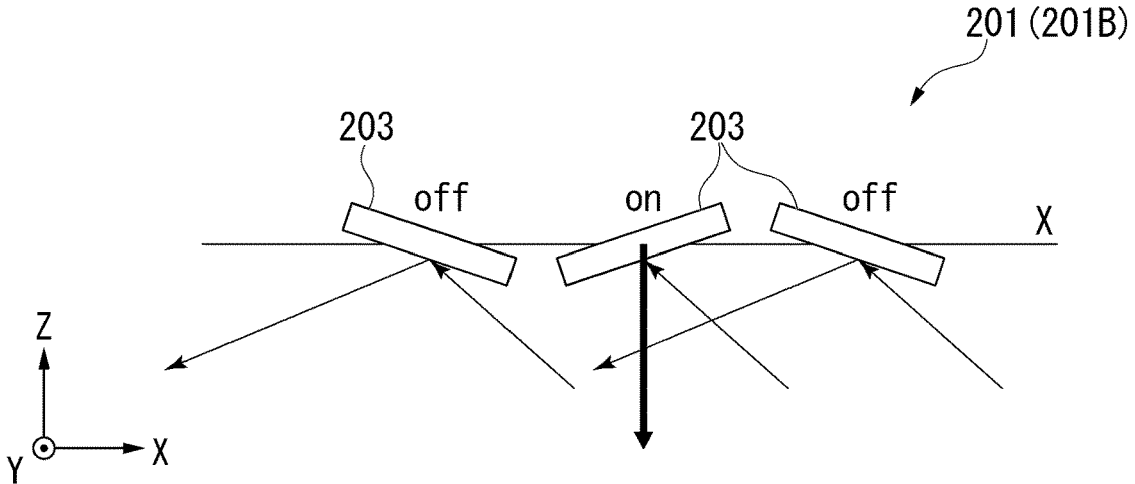
FIG. 12 is a side view showing an outline of the configuration of the light modulation unit of the second example of the present embodiment and is a view showing an ON state of the mirror at the middle of the plane of paper and an OFF state of mirrors at both end sides of the plane of paper.

On the other hand, as the spatial light modulator 201, in place of the spatial light modulator 201A of the first example shown in FIG. 4 to FIG. 6, a spatial light modulator 201B of the second example shown in in FIG. 10 to FIG. 12 can be employed.

In the spatial light modulator 201B of the second example, the micromirror 203 is rotatable around the first tilt axis T1 that extends in a diagonal direction of the micromirror 203. The micromirror 203 rotates to a first side (for example, a + side) around the first tilt axis T1, and thereby, the micromirror 203 becomes the ON state. The micromirror 203 rotates to a second side (for example, a − side) around the first tilt axis T1, and thereby, the micromirror 203 becomes the OFF state.

In this case, since the first tilt axis T1 is substantially parallel to the Y axis, the micromirror 203 (the micromirror 203 tilted around the first tilt axis T1) in the ON state is tilted relative to the X-axis direction which is the scan direction. The case where the first tilt axis T1 is substantially parallel to the Y axis includes the case where the first tilt axis T1 is rotated by about ±5 degrees around the Z axis relative to the Y axis. According to such an arrangement, the resolution of the spatial light modulator 201B can be increased. However, the first tilt axis T1 may be completely parallel to the Y axis.

Also in the spatial light modulator 201B of the second example as described above, each the plurality of micromirrors 203 rotates around the first tilt axis T1, the plurality of micromirrors 203 adjust the tilts of the plurality of micromirrors 203 relative to the scan direction and become the ON state, and thereby, light is emitted to the projection module 17. Further, in this case, each of the plurality of micromirrors 203 rotates around the first tilt axis T1, and thereby, the ON state and the OFF state are switched.

In the spatial light modulator 201B of the second example, the plurality of micromirrors are linearly aligned in each of two directions tilted by 45° relative to both the scan direction and the first tilt axis T1 direction. In other words, the micromirror 203 of the spatial light modulator 201B of the second example is arranged to be rotated by about 45° around the Z-axis relative to the micromirror 203 of the spatial light modulator 201A of the first example. Also in the spatial light modulator 201B of the second example, a plurality of micromirrors 203 are aligned in the scan direction.

In the following description, when the spatial light modulator 201A of the first example and the spatial light modulator 201B of the second example are not distinguished, the spatial light modulator 201A and the spatial light modulator 201B are collectively referred to as the spatial light modulator 201.

In the present embodiment, as shown in FIG. 3, the light modulation unit 20 further includes an angle adjustment mechanism 204. The angle adjustment mechanism 204 adjusts the tilt angle Δ relative to the scan direction of the spatial light modulator 201. Examples of the angle adjustment mechanism 204 include the following configuration. That is, in the configuration, the angle adjustment mechanism 204 includes a stage 14 for the spatial light modulator 201 (not shown), and the stage 14 for the spatial light modulator 201 supports the spatial light modulator 201 rotatably around a second tilt axis T2. The second tilt axis T2 extends in the Y-axis direction (the first tilt axis T1 direction). The stage 14 for the spatial light modulator 201 may support the spatial light modulator 201, for example, such that the spatial light modulator 201 is movable in the X-axis direction, the Y-axis direction, and the Z-axis direction (OZ direction).

Figure 13:
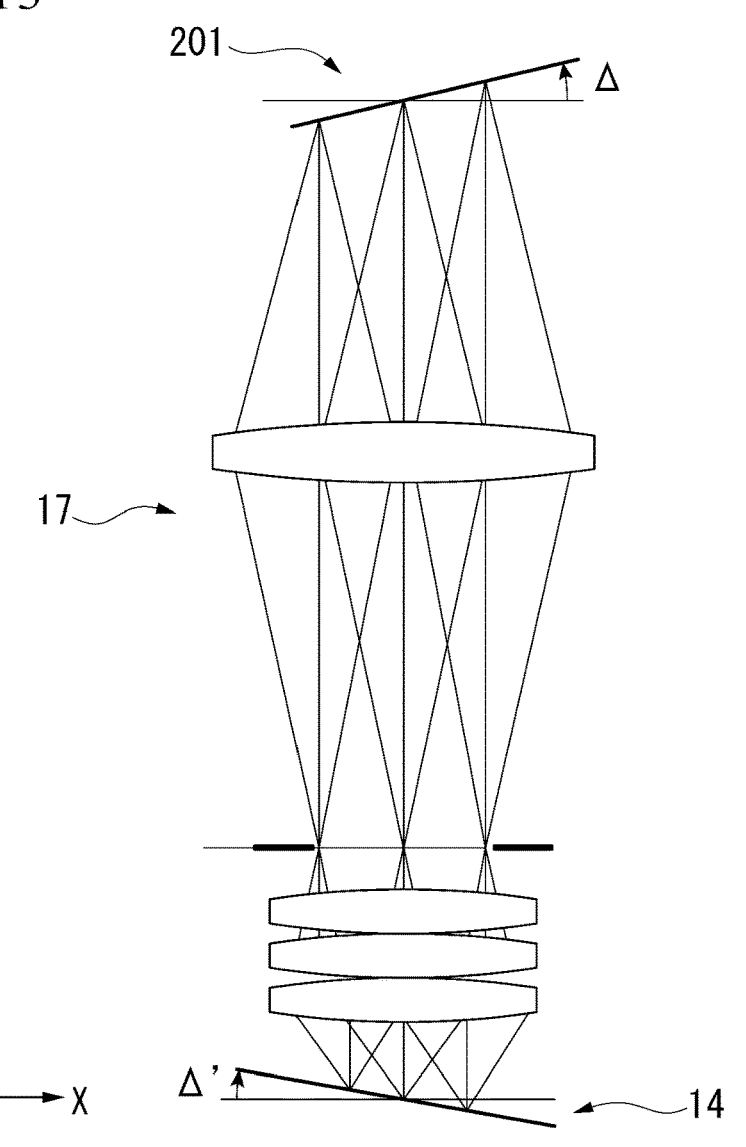
FIG. 13 is a view showing a relationship between a tilt of an image plane of the projection module and a tilt of the spatial light modulator of the present embodiment.

As shown in FIG. 13, the spatial light modulator 201 is tilted relative to the scan direction. The spatial light modulator 201 is tilted relative to the XY plane. The spatial light modulator 201 is tilted relative to the scan direction in a side view of the exposure apparatus 1 in which the exposure apparatus 1 is seen from the Y-axis direction (the first tilt axis T1 direction).

[Calibration of Spatial Light Modulator]

Figure 14:
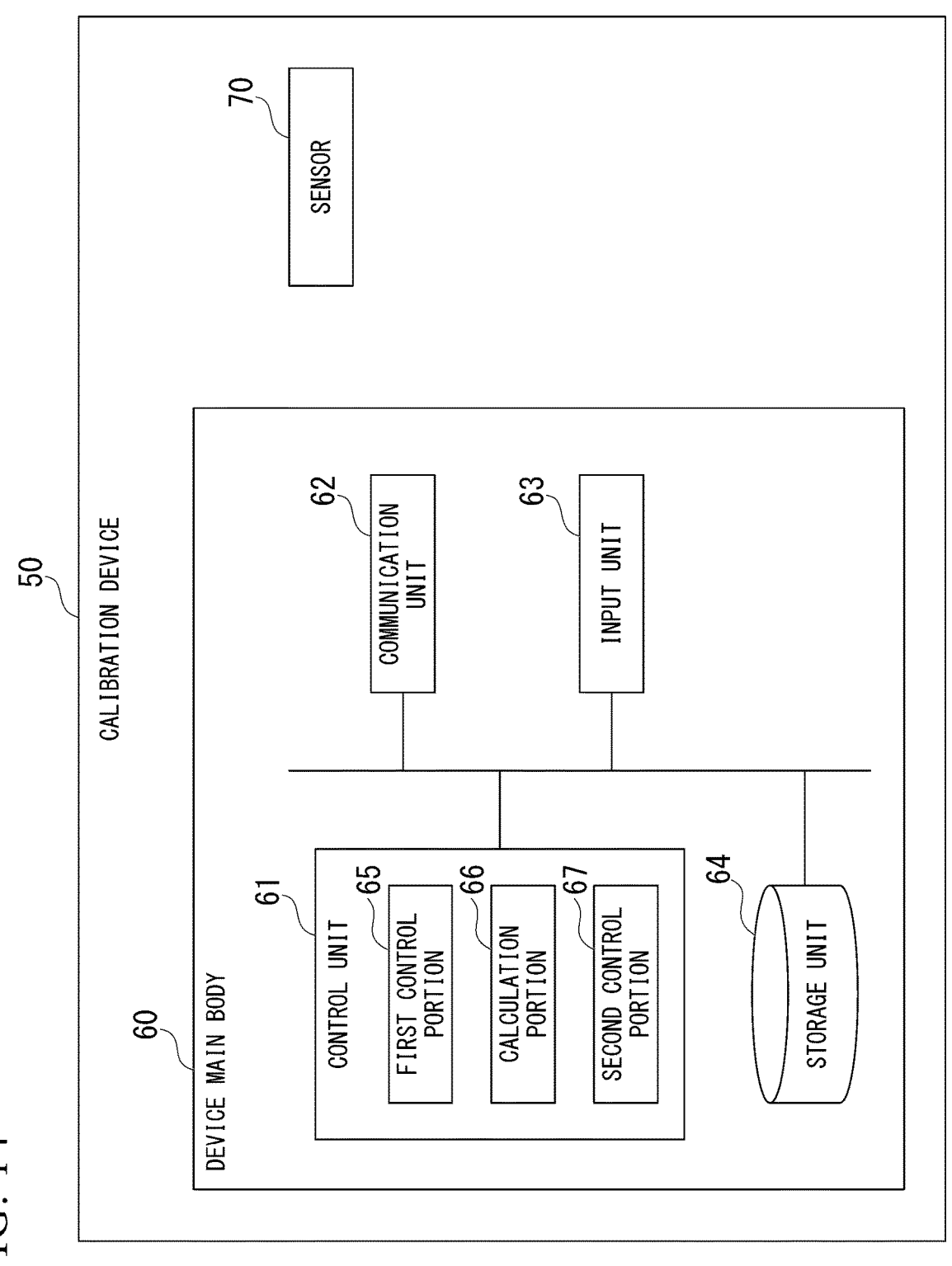
FIG. 14 is a functional block diagram showing an outline of a calibration device of the present embodiment.

Here, as shown in FIG. 14, in the present embodiment, the light modulation unit further includes a calibration device 50. The calibration device 50 calibrates a tilt angle Δ of the spatial light modulator 201.

The calibration device 50 includes a device main body 60 and a sensor 70.

The device main body 60 is implemented, for example, by a device such as a personal computer, a server, or an industrial computer. The device main body 60 may also be used by a control device of the exposure apparatus 1 that controls the entire exposure apparatus 1.

The device main body 60 includes a processor such as a CPU (Central Processing Unit) and a memory that are connected by a bus and executes a program. The device main body 60 functions as a device that includes a control unit 61, a communication unit 62, an input unit 63, and a storage unit 64 by executing a program.

More specifically, in the device main body 60, the processor reads a program stored in the storage unit 64 and stores the read program in the memory. By the processor executing the program stored in memory, the device main body 60 functions as the device that includes the control unit 61, the communication unit 62, the input unit 63, and the storage unit 64.

The control unit 61 controls an operation of the spatial light modulator 201 and an operation of the angle adjustment mechanism 204. The control unit 61 is constituted of, for example, a processor and a memory. The control unit 61 functions as a first control portion 65, a calculation portion 66, and a second control portion 67.

The first control portion 65 controls an operation of the spatial light modulator 201. The first control portion 65 transmits an operation amount for causing the micromirror 203 to be at a target angle to the micromirror 203 and tilts the micromirror 203. The target angle is a target of the tilt angle of the micromirror 203 when the micromirror 203 is in the ON state. The micromirrors 203 controlled by first control portion 65 may be part of the plurality of micromirrors 203 or may be all of the plurality of micromirrors 203.

The calculation portion 66 calculates the difference between the target angle of the micromirror 203 and the actual tilt angle of the micromirror 203. The actual tilt angle of the micromirror 203 is an actual tilt angle of the micromirror 203 in the ON state. The actual tilt angle of the micromirror 203 is detected by a sensor 70.

The second control portion 67 controls an operation of the angle adjustment mechanism 204. The second control portion 67 controls the operation of the angle adjustment mechanism 204 on the basis of the difference calculated by the calculation portion 66. The second control portion 67 controls the angle adjustment mechanism 204 and tilts the spatial light modulator 201 such that the deviation (error) of the actual tilt angle relative to the target angle of the micromirror 203 is corrected.

When the first control portion 65 controls the plurality of micromirrors 203, the calculation portion 66 can calculate the difference for every micromirror 203. On the other hand, since the angle adjustment mechanism 204 tilts the entire spatial light modulator 201, one operation amount may be transmitted by the second control portion 67 to the angle adjustment mechanism 204.

Therefore, when the first control portion 65 controls the plurality of micromirrors 203, the second control portion 67 can control the angle adjustment mechanism 204 by using a representative value of a plurality of differences described above calculated by the calculation portion 66. The representative value may be, for example, an average value of the plurality of differences or may be a median value of the plurality of differences.

The communication unit 62 includes a communication interface for connecting the device main body 60 to an external device. The communication unit 62 communicates with the external device in a wired or wireless manner. The external device is, for example, the spatial light modulator 201, the angle adjustment mechanism 204, or the sensor 70.

The input unit 63 includes an input device such as a mouse, a keyboard, or a touch panel.

The input unit 63 may be constituted as an interface that connects the input devices to the device main body 60. The input unit 63 receives an input of various information to the device main body 60. For example, a command of a calibration start from an operator is input to the input unit 63.

The storage unit 64 is constituted by using a computer readable storage medium device such as a magnetic hard disk device or a semiconductor storage device. The storage unit 64 stores various information about the calibration device 50. The storage unit 64 stores information input, for example, via the communication unit 62 or the input unit 63. The storage unit 64 stores various information generated, for example, by executing a process by the control unit 61. The storage unit 64 stores, for example, a detection result detected by the sensor 70. The storage unit 64 stores, for example, a target angle of the micromirror 203 when the micromirror 203 is turned on.

The sensor 70 detects the tilt angle of the micromirror 203. The sensor 70 detects the tilt angle of the micromirror 203 controlled by the first control portion 65. A known configuration can be employed as the sensor 70.

The calibration device 50 as described above performs calibration before exposing the exposure target object.

In the calibration, for example, the input unit 63 first receives an input that starts the calibration from the operator. Then, the first control portion 65 transmits the operation amount for causing the micromirror 203 to be at the target angle to the micromirror 203 and tilts the micromirror 203. At this time, the sensor 70 detects the actual tilt angle of the micromirror 203. Then, the calculation portion 66 calculates the difference between the target angle of the micromirror 203 and the actual tilt angle of the micromirror 203 on the basis of the target angle stored by the storage unit 64 and the detection result of the sensor 70. The second control portion 67 controls the angle adjustment mechanism 204 on the basis of the difference calculated by the calculation portion 66.

All or part of the functions of the calibration device 50 may be implemented by using hardware such as an ASIC (Application Specific Integrated Circuit), a PLD (Programmable Logic Device), or a FPGA (Field Programmable Gate Array). The program may be recorded on a computer readable recording medium. The computer readable recording medium is, for example, a flexible disk, a magneto-optical disk, a portable medium such as a ROM or a CD-ROM, or a storage device such as a hard disk embedded in a computer system. The program may be transmitted via a telecommunications line.

However, part or all of the calibration device 50 may be eliminated. For example, the operator of the exposure apparatus 1 can also calibrate the tilt angle $\Delta$ of the spatial light modulator 201.

In an exposure method using the exposure apparatus 1 described above, after performing calibration (first step), the exposure target object is exposed by using the exposure apparatus 1 (second step).

It is preferable that the calibration be performed again after exposures are performed several times. The calibration may be performed periodically every certain times of exposures. The calibration may be performed periodically every time a certain period of time elapses. Thereby, even when the secular change of the micromirror 203 occurs, and the difference (error) of the actual tilt angle relative to the target angle of the micromirror 203 is changed, the difference is appropriately corrected.

Here, as shown in FIG. 13, in the spatial light modulator 201 tilted in the scan direction, the image is focused such that Expression (1) described below is satisfied from a so-called Scheimpflug relationship.

$$\tan \Delta'=\beta \cdot \tan \Delta \tag{1}$$

$\Delta$: tilt angle of the spatial light modulator 201
$\beta$: magnification of the projection module 17
$\Delta'$: tilt angle of the image plane That is, the image plane becomes a tilted state in the scan direction. In this case, the image plane of the projection module 17 is tilted relative to the scan direction so as to include the best focus with respect to the surface of the exposure target object parallel to the scan direction. When the image plane is tilted in this way, part of the image plane defocuses with respect to the surface of the exposure target object. However, for example, the tilt of the image plane is not a tilt relative to the Y-axis direction or the like but is a tilt relative to the scan direction (X-axis direction). Therefore, the image is averaged in the exposure width by the scanning exposure, and the effect of the defocus is relieved.

Here, in the present embodiment, the exposure apparatus 1 includes a plurality of exposure modules. In the present embodiment, each of the plurality of exposure modules includes the angle adjustment mechanism 204 and the calibration device 50 described above.

In this case, it is preferable that the tilt angle Δ of the spatial light modulator 201 in each exposure module be adjusted such that the average positions of the image planes in the scan direction of the plurality of projection modules 17 substantially coincide with each other. Further, one projection module 17 (for example, the first projection module 17A) and another projection module 17 (for example, the second projection module 17B) may perform a joint exposure. Further, one projection module 17 itself differentiates the position in the Y-axis direction and performs a scanning exposure, and thereby, the joint exposure may be performed. By averaging the image plane in the scan direction in this way, it is possible to prevent a sharp contrast change, and the contrast change of a joint exposure portion can also be smoothed.

In the exposure apparatus 1 described above, the tilt angle of the spatial light modulator 201 may be adjustable for each pattern with which the exposure is performed. In the exposure method described above, the tilt angle of the spatial light modulator 201 may be adjusted for each pattern with which the exposure is performed. The adjustment of the tilt angle as described above may be performed, for example, by the calibration device 50 controlling the angle adjustment mechanism 204, or may be performed by the control device of the exposure apparatus 1 that controls the entire exposure apparatus 1 controlling the angle adjustment mechanism 204. Thereby, a so-called telecentric deviation can be corrected.

FIGS. 7, 8, and 9 describe the case where a vertex of the sinc 2 function matches a comb-shaped function discretely generated by the diffraction pitch. However, when an angle deviation (error) of the micromirror 203 actually occurs, the position of the vertex of the sinc 2 function and the position of the comb-shaped function are deviated from each other by the amount of the angle deviation. By this deviation, the telecentric deviation occurs. The angle adjustment mechanism 204 adjusts the tilt angle in order to correct the displacement amount. Further, since the direction of diffracted light emitted from the spatial light modulator 201 differs for each recipe (each exposure pattern), the deviation amount also changes for each exposure pattern. That is, a difference of the displacement amount occurs between the angle deviation generated by an isolated mirror as shown in FIG. 7 and the angle deviation generated by the LIS as shown in FIG. 9. In this way, since the deviation amount differs depending on the exposure pattern, in the exposure apparatus 1, the adjustment amount of the tilt angle of the spatial light modulator 201 may be changed for each pattern. In other words, it is preferable that the tilt angle of the spatial light modulator 201 can be set and adjusted for each recipe so as to correct the telecentric deviation with respect to an important exposure pattern.

[Simulation]

Figure 16:
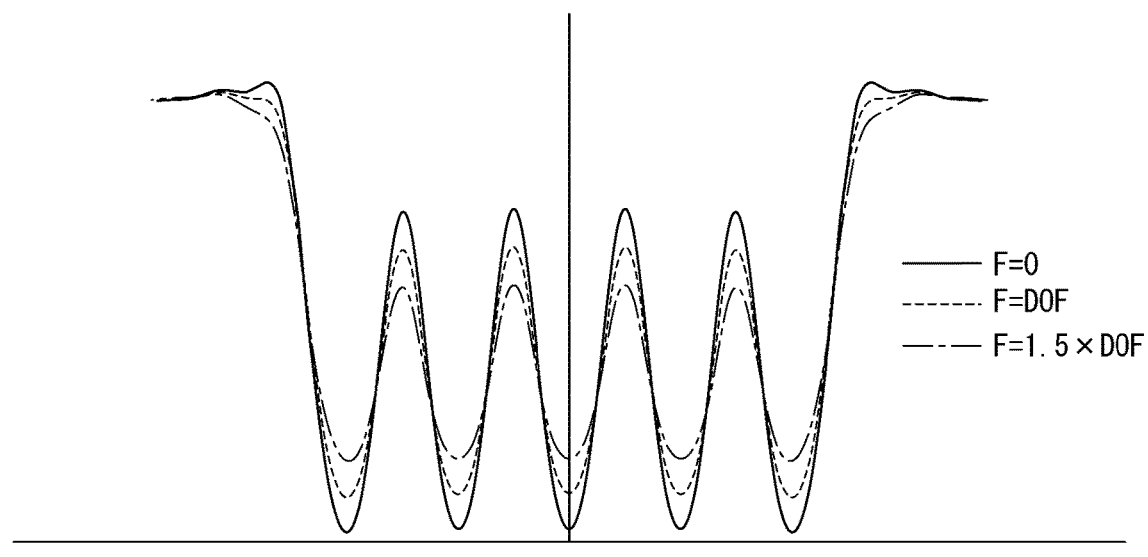
FIG. 16 is a graph showing a result of a simulation when the spatial light modulator is not tilted.
Figure 17:
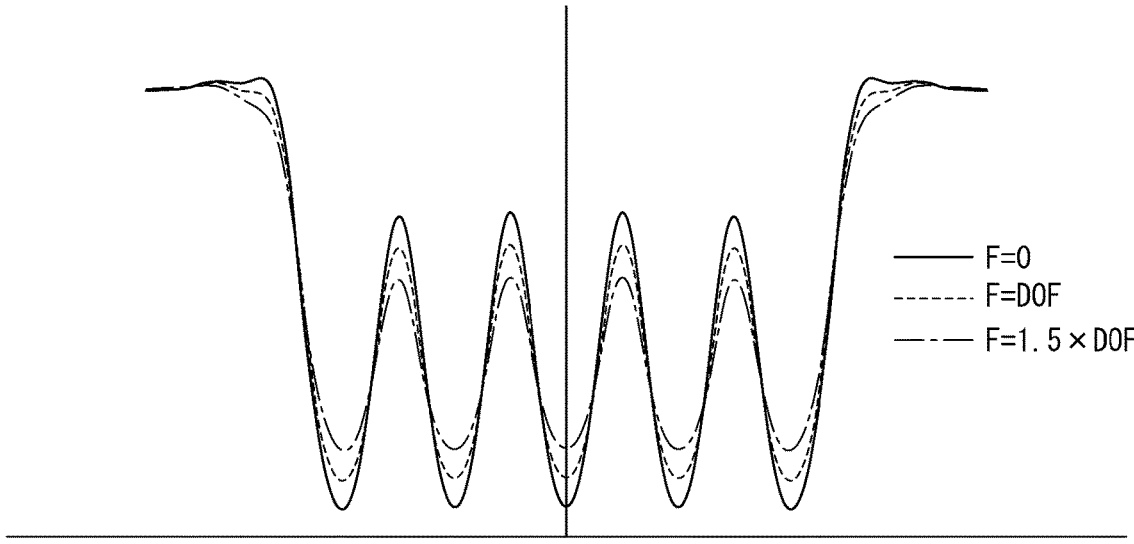
FIG. 17 is a graph showing a result of a simulation when the spatial light modulator is tilted by an amount corresponding to a DOF.
Figure 18:
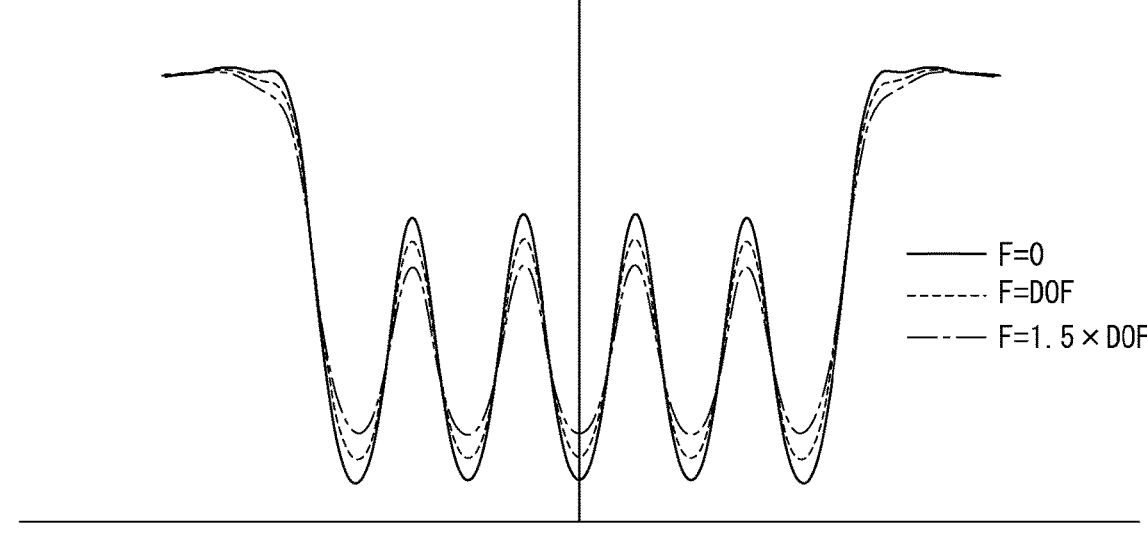
FIG. 18 is a graph showing a result of a simulation when the spatial light modulator is tilted by 1.5 times of the amount corresponding to the DOF.

FIG. 16 to FIG. 18 are views showing results of simulations with respect to the relationship between the tilt of the spatial light modulator 201 and an optical spatial image.

Figure 15:
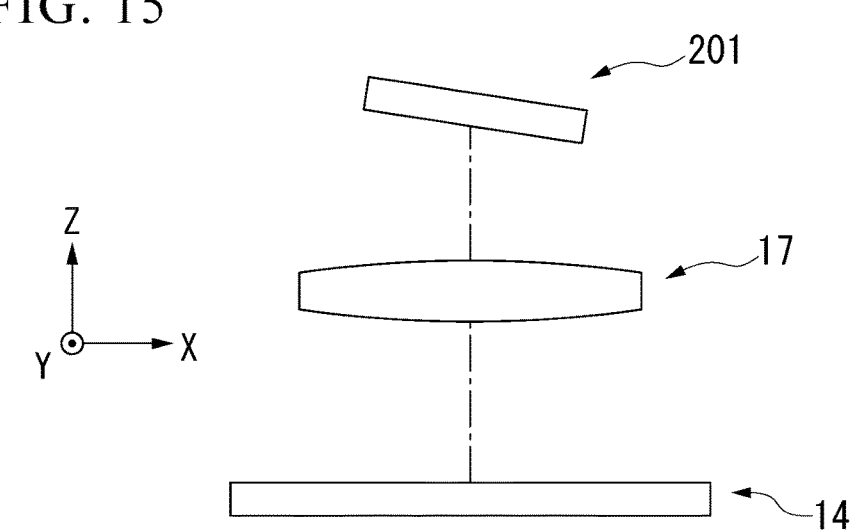
FIG. 15 is a view showing an outline of a simulation.

FIG. 16 to FIG. 18 are views showing simulation results of three cases: (1) when the spatial light modulator 201 is not tilted; (2) when the spatial light modulator 201 is tilted such that the image plane is tilted by an amount corresponding to a depth of focus DOF of the projection module 17 as shown in FIG. 15; and (3) when the spatial light modulator 201 is tilted such that the image plane is tilted by 1.5 times of the amount corresponding to the DOF.

Further, simulations were performed in each of the cases (1) to (3) described above for three cases where the defocus was <1>0, <2> the amount corresponding to the DOF, and <3>1.5 times of the amount corresponding to the DOF.

That is, simulations were performed for a total of nine cases.

The prerequisite of the simulation is as follows.

Numerical aperture of the projection module 17: NA=0.243

Numerical aperture of the illumination optical system 162/numerical aperture of the projection module 17:σ=0.7

Wavelength of light: λ=405 nm

Line and space pattern: 1 μm L/S (k=0.6)

Size (length of one side) of each micromirror 203 of the spatial light modulator 201: 5 μm Exposure width in the scan direction: 10 mm Projection magnification of the projection module 17: ⅕

Depth of focus of the projection module 17: DOF=±3.43 μm

In the case (2) described above, when the size, the optical magnification, and the like of the micromirror 203 are the prerequisite described above, a simulation corresponding to the tilt angle of about 1 degree on the DMD is performed. That is, in this case, a tilt angle Δ' of the image plane is 3.43 mrad, and a tilt angle Δ of the spatial light modulator 201 is 17.15 mrad which is 5 times of the tilt angle Δ' of the image plane. 17.15 mrad is about 0.98°.

FIG. 16 represents a result of the case (1) described above. FIG. 17 represents a result of the case (2) described above. FIG. 18 represents a result of the case (3) described above. In each graph, the cases (each of the cases <1> to <3> described above) where the defocus is different are represented by a solid line (<1>), a dashed line (<2>), and a dashed-dotted line (<3>).

From these results, the contrast is not reduced by a defocus of the amount corresponding to the DOF or more, and an image is formed. Further, an image change is clearly decreased as the tilt angle Δ of the spatial light modulator 201 is increased.

Here, in general, in the joint exposure when a large screen is formed by the scanning exposure, when the contrast change of the image of the joint portion is large, unevenness is significantly recognized in many cases. On the other hand, according to the exposure apparatus 1 according to the present embodiment, it is possible to decrease the contrast change of the image when a joint exposure is performed using a plurality of exposure modules or when a joint exposure is performed using a single exposure module compared to a conventional exposure. Accordingly, the present embodiment provides a significant advantage with respect to the unevenness described above.

The disclosures of all of United States Patent Application, Publications and United States Patents relating to the exposure apparatus and the like cited in the embodiments described above are incorporated herein by reference and are part of the descriptions of the present specification.

As described above, the illumination apparatus and the exposure apparatus of the present invention is suitable for illuminating an object with illumination light and exposing the object in a lithography process. Further, the flat panel display manufacturing method of the present invention is suitable for producing a flat panel display.

The sensor 70 may be, for example, an illuminance sensor. In the case of such a configuration, a pinhole may be present on the illuminance sensor. When the micromirror 203 is present at a correct angle, the illuminance becomes a normal value. However, when the tilt angle of the micromirror 203 is deviated, part of the reflection light from the micromirror 203 is kicked by the pinhole (does not pass through the pinhole), and the detected illuminance is decreased. From the degree of this decrease, the difference between the target angle of the micromirror 203 and the actual tilt angle can be calculated. When such an illuminance sensor is employed as the sensor 70, examples of the arrangement place of the sensor 70 include the stage 14.

Figure 19:
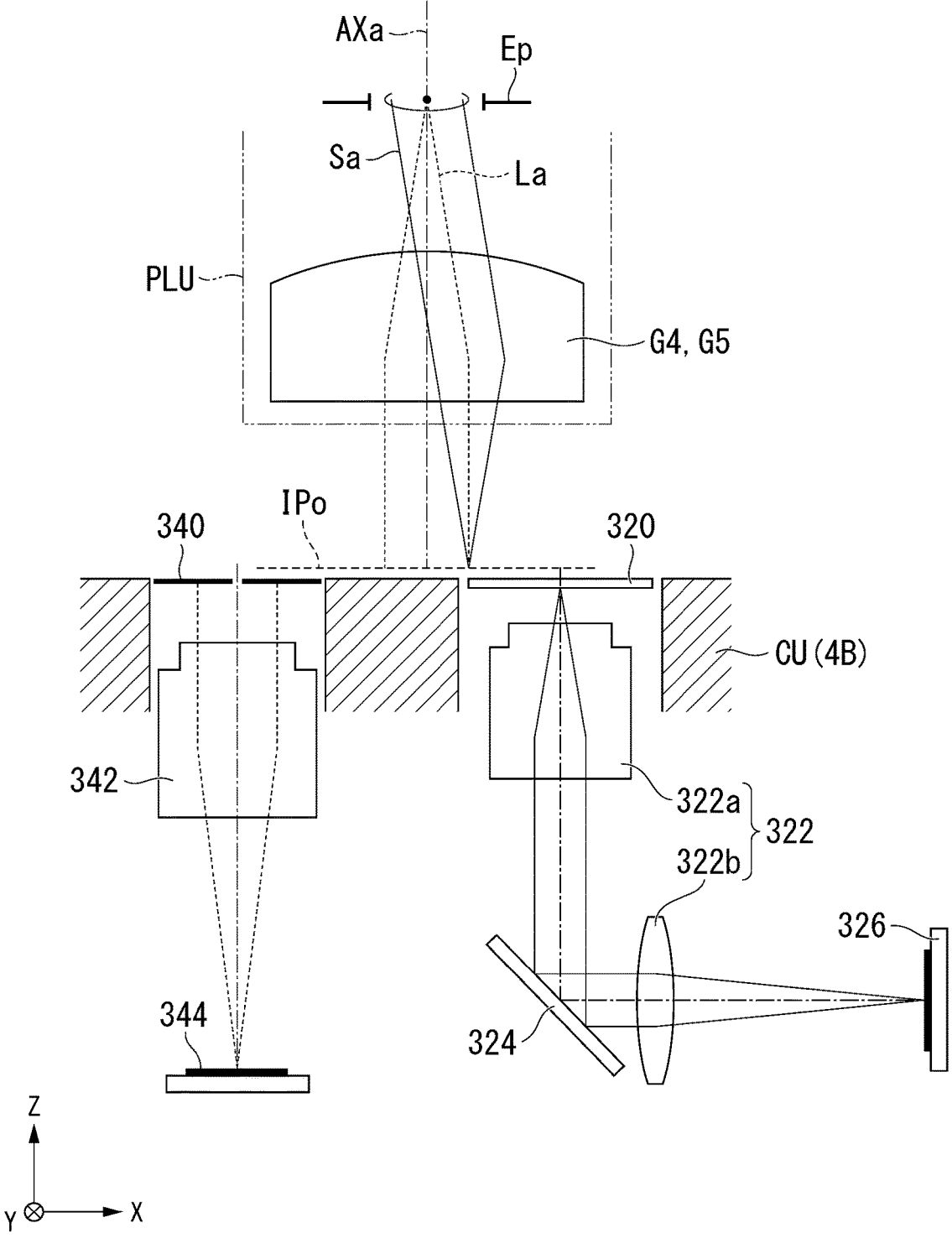
FIG. 19 is a view showing a schematic configuration of an optical measurement unit provided on a calibration reference unit CU provided on an end of a substrate holder of the exposure apparatus.

FIG. 19 is a view showing a schematic configuration of an optical measurement unit provided on a calibration reference unit CU provided on an end on a substrate holder of the exposure apparatus 1. In FIG. 19, reflection light (imaging beam) Sa from the spatial light modulator 201 passes through lens groups G4 and G5 on the image plane side of a projection unit PLU (17) and forms an image on the best focus plane (the best imaging plane) IPo, and a principal ray La of the reflection light Sa is parallel to an optical axis AXa. A first optical measurement unit includes: a quartz plate 320 attached to an upper surface of the calibration reference unit CU; an imaging system 322 (an objective lens 322a and a lens group 322b) that forms an enlarged image of a pattern image by the spatial light modulator 201 projected via the quartz plate 320 from the projection unit PLU; a reflection mirror 324; and an imaging element 326 by way of a CCDD or a CMOS that captures the enlarged pattern image. The surface of the quartz plate 320 and the imaging surface of the imaging element 326 are in a conjugate relationship.

A second optical measurement unit includes: a pinhole plate 340 attached to the upper surface of the calibration reference unit CU; an objective lens 342 which the reflection light (imaging beam) Sa from the spatial light modulator 201 projected from the projection unit PLU enters through the pinhole plate 340 and forms an image (intensity distribution of a light source image and the imaging beam in a pupil Ep) of a pupil Ep of the projection unit PLU; and an imaging element 344 by way of a CCDD or a CMOS that captures an image of the pupil Ep. That is, the imaging surface of the imaging element 344 of the second optical measurement unit has a conjugate relationship with the position of the pupil Ep of the projection unit PLU.

Since a substrate holder (calibration reference unit CU) can be two-dimensionally moved in the XY plane by the stage 14, the quartz plate 320 of the first optical measurement unit or the pinhole plate 340 of the second optical measurement unit is arranged directly below any projection unit PLU to be measured, and reflection light Sa corresponding to various test patterns for measurement is generated by the spatial light modulator 201. In the measurement by the first optical measurement unit, the substrate holder (calibration reference unit CU), the entire projection unit PLU, or the lens groups G4 and G5 are moved upward and downward such that the surface of the quartz plate 320 is defocused by a certain amount in each of the +Z direction and the −Z direction relative to the best focus plane IPo.

Then, the difference between the target angle of the micromirror 203 and the actual tilt angle can be calculated based on a defocus amount (±Z micromotion range) and a lateral deviation amount of the image of a test pattern imaged by the imaging element 326 at each of the time of defocus in the +Z-direction defocus and the time of defocus in the −Z-direction. The imaging element 326 of the first optical measurement unit is imaging a mirror surface of the spatial light modulator 201 via the projection unit PLU and therefore can also be used to confirm a faulty micromirror 203 of the many micromirrors 203 of the spatial light modulator 201.

Further, in the measurement by the second optical measurement unit, the eccentricity or the like of the intensity distribution within the pupil Ep of the imaging beam (Sa) formed on the pupil Ep of the projection unit PLU at the time of projection of the test pattern is measured by the imaging element 344. In this case, the difference between the target angle of the micromirror 203 and the actual tilt angle can be calculated based on the eccentricity amount of the intensity distribution within the pupil Ep and the focal length or the like on the image plane side of the projection unit PLU. Further, among the many micromirrors 203 of the spatial light modulator 201, only a particular single micromirror 203 is turned on, and the position relationship between the optical axis Axa and the center of gravity of the intensity distribution formed on the pupil Ep by the imaging element 344 of the second optical measurement unit is measured. When deviation of the position relationship occurs, it is found that a tilt angle θd of a particular ON-state micromirror 203a has an error from a standard value (for example, 17.5°).

Although the measurement time is required, by causing the entire micromirrors 203 of the spatial light modulator 201 to be in the ON state one by one and performing the measurement using the imaging element 344 in this way, the error (drive error) of the tilt angle θd of each micromirror 203 can also be obtained.

Although one embodiment of the present invention has been described in detail with reference to the drawings, the specific configuration is not limited to those described above, and various design changes or the like can be made without departing from the scope of the present invention.

In an embodiment, an exposure apparatus (1) includes: an illumination optical system (16, 162); a spatial light modulator (201) that is illuminated with light from the illumination optical system (16, 162); a projection optical system (17) that illuminates an exposure target with light emitted from the spatial light modulator (201); and a stage (14) on which the exposure target is placed. By the stage (14) moving the exposure target in a predetermined scan direction, the light which illuminates the exposure target by the projection optical system (17) scans on the exposure target. The spatial light modulator (201) includes a plurality of mirrors (203). Each of the plurality of mirrors (203) rotates around a tilt axis that extends in a direction orthogonal to both the scan direction and an optical axis direction of the projection optical system (17), the plurality of mirrors (203) become an ON state by adjusting a tilt of each of the plurality of mirrors relative to the scan direction and thereby emit light to the projection optical system (17), and the exposure apparatus includes an angle adjustment mechanism (204) that adjusts a tilt angle of the spatial light modulator (201) relative to the scan direction.

In an example, the exposure apparatus (1) further includes a calibration device (50) that calibrates the tilt angle of the spatial light modulator (201). The calibration device (50) includes: a storage unit (64) that stores, when at least one or more mirrors of the plurality of mirrors (203) is caused to be in an ON state, a target angle of the one or more mirrors; a first control portion (65) that transmits, to the one or more mirrors, an operation amount for causing the one or more mirrors to be at the target angle and tilts the one or more mirrors; a sensor (70) that detects a tilt angle of the one or more mirrors; a calculation portion (66) that calculates a difference between the target angle of the one or more mirrors and an actual tilt angle of the one or more mirrors based on the target angle stored by the storage unit (64) and a detection result of the sensor; and a second control portion (67) that controls the angle adjustment mechanism (204) based on the difference calculated by the calculation portion (66).

In an embodiment, an exposure apparatus (1) includes: an illumination optical system (16, 162); a spatial light modulator (201) that is illuminated with light from the illumination optical system (16, 162); a projection optical system (17) that illuminates an exposure target with light emitted from the spatial light modulator (201); and a stage (14) on which the exposure target is placed. By the stage (14) moving the exposure target in a predetermined scan direction, the light which illuminates the exposure target by the projection optical system (17) scans on the exposure target. The spatial light modulator (201) includes a plurality of mirrors (203). Each of the plurality of mirrors (203) rotates around a tilt axis that extends in a direction orthogonal to both the scan direction and an optical axis direction of the projection optical system (17), and the plurality of mirrors (203) become an ON state by adjusting a tilt of each of the plurality of mirrors relative to the scan direction and thereby emit light to the projection optical system (17). The spatial light modulator (201) is tilted relative to the scan direction.

In an example, an image plane of the projection optical system (17) is tilted relative to the scan direction so as to include the best focus with respect to a surface of the exposure target.

In an example, a tilt angle of the spatial light modulator (201) is adjustable for each recipe with which an exposure is performed.

In an embodiment, in an exposure method, the exposure target is exposed by using the exposure apparatus (1) described above. The exposure method includes: a first step in which the spatial light modulator (201) is tilted relative to the scan direction based on a difference, when in order to cause one or more mirrors of the plurality of mirrors (203) to be in an ON state, the one or more mirrors are rotated around the tilt axis, between a target tilt angle of the one or more mirrors and an actual tilt angle of the one or more mirrors; and a second step in which after the first step, the exposure target is exposed by using the exposure apparatus (1).

In an example, after the second step is performed a plurality of times, the first step is performed again.

In an embodiment, a flat panel display manufacturing method includes: exposing the exposure target by the exposure method described above; and developing the exposed exposure target.

In an embodiment, the exposure apparatus (1) exposes an exposure target while moving the exposure target in a scan direction. The exposure apparatus (1) includes: an illumination optical system (16, 162); a spatial light modulator (201) that is illuminated with light from the illumination optical system (16, 162); a projection optical system (17) that illuminates an exposure target with light emitted from the spatial light modulator (201); and a stage (14) on which the exposure target is placed and which moves in the scan direction. The illumination optical system (16, 162) and the spatial light modulator (201) are arranged side by side in a scan direction.

In an embodiment, an exposure apparatus (1) includes: a stage (14) that moves an exposure target in a scan direction; a spatial light modulator (201); an illumination optical system (16, 162) that illuminates the spatial light modulator (201); and a projection optical system (17) that illuminates the exposure target with light reflected by a mirror (203) of the spatial light modulator (201), wherein a plane including an optical axis of the projection optical system (17) and an optical axis of illumination light that illuminates the spatial light modulator (201) is provided in parallel with the scan direction.

In an example, the mirror (203) of the spatial light modulator (201) is tilted relative to the scan direction.

What is claimed is:

1. An exposure apparatus comprising:
an illumination optical system;
a spatial light modulator that is illuminated with light from the illumination optical system, the spatial light modulator including a plurality of mirrors;
a projection optical system that illuminates an exposure target with light emitted from the spatial light modulator;
a stage capable of supporting the exposure target; and
an angle adjustment mechanism that adjusts a tilt angle of a surface supporting the plurality of mirrors with respect to a plane orthogonal to an optical axis of the projection optical system, wherein
the stage moves the exposure target in a scan direction so that the light from the projection optical system scans on the exposure target,
each of the plurality of mirrors rotates around a tilt axis that extends in a direction orthogonal to both the scan direction and an optical axis direction of the projection optical system, and
the plurality of mirrors become an ON state by adjusting a tilt of each of the plurality of mirrors relative to the plane so as to emit light to the projection optical system.

2. The exposure apparatus according to claim 1, further comprising:
a calibration device that calibrates the tilt angle of the surface supporting the plurality of mirrors,
wherein the calibration device comprises:
a storage unit that stores a target angle of one or more mirrors of the plurality of mirrors in the ON state;
a first control portion that transmits, to the one or more mirrors, an operation amount for causing the one or more mirrors to be at the target angle and tilts the one or more mirrors;
a sensor that detects a tilt angle of the one or more mirrors;
a calculation portion that calculates a difference between the target angle of the one or more mirrors and an actual tilt angle of the one or more mirrors based on the target angle stored by the storage unit and a detection result of the sensor; and
a second control portion that controls the angle adjustment mechanism based on the difference calculated by the calculation portion.

3. An exposure apparatus comprising:
an illumination optical system;
a spatial light modulator that is illuminated with light from the illumination optical system, the spatial light modulator including a plurality of mirrors;
a projection optical system that illuminates an exposure target with light emitted from the spatial light modulator; and a stage on which the exposure target is placed, wherein by the stage moving the exposure target in a scan direction, the light which illuminates the exposure target by the projection optical system scans on the exposure target, each of the plurality of mirrors rotates around a tilt axis that extends in a direction orthogonal to both the scan direction and an optical axis direction of the projection optical system, the plurality of mirrors become an ON state by adjusting a tilt of each of the plurality of mirrors relative to a plane orthogonal to an optical axis of the projection optical system so as to emit light to the projection optical system, and the spatial light modulator is tilted relative to the plane.

4. The exposure apparatus according to claim 1, wherein an image plane of the projection optical system is tilted relative to the scan direction so as to include the best focus with respect to a surface of the exposure target.

5. The exposure apparatus according to claim 1, wherein the tilt angle of the surface supporting the plurality of mirrors is adjustable for each recipe with which an exposure is performed.

6. An exposure method of exposing an exposure target by using the exposure apparatus according to claim 1, the exposure method comprising:

a first step in which the surface supporting the plurality of mirrors is tilted relative to the scan direction based on a difference, when in order to cause one or more mirrors of the plurality of mirrors to be in the ON state, the one or more mirrors are each rotated around the tilt axis, between a target tilt angle of the one or more mirrors and an actual tilt angle of the one or more mirrors; and a second step in which, after the first step, the exposure target is exposed by using the exposure apparatus.

7. The exposure method according to claim 6, wherein, after the second step is performed a plurality of times, the first step is performed again.

8. A flat panel display manufacturing method comprising:

exposing the exposure target by the exposure method according to claim 6; and developing the exposed exposure target.

9. An exposure apparatus comprising:

an illumination optical system;

a spatial light modulator illuminated with light from the illumination optical system, the spatial light modulator including a plurality of mirrors;

a projection optical system that illuminates an exposure target with light from the spatial light modulator; and a stage with a top surface capable of supporting the exposure target, the stage being capable of moving in a first direction, wherein the illumination optical system includes:

a first lens that guides incident light downward; and a first mirror that guides light passed through the first lens to the plurality of mirrors, the first lens is positioned lower than the first spatial light modulator, and in the plan view, the first lens and the spatial light modulator are arranged in the first direction without overlapping each other.

10. An exposure apparatus comprising:

a stage that moves an exposure target in a scan direction;

a spatial light modulator;

an illumination optical system that illuminates the spatial light modulator; and a projection optical system that illuminates the exposure target with light reflected by a plurality of mirrors of the spatial light modulator, wherein a surface supporting the plurality of mirrors is tilted with respect to a plane orthogonal to an optical axis of the projection optical system, and a plane including the optical axis of the projection optical system and an optical axis of illumination light that illuminates the spatial light modulator is provided in parallel with the scan direction.

11. The exposure apparatus according to claim 10, wherein one or more of the plurality of mirrors of the spatial light modulator are tilted relative to the scan direction.

\* \* \* \* \*